United States Patent [19]
Lefevre et al.

[11] Patent Number: 5,802,085
[45] Date of Patent: *Sep. 1, 1998

[54] SINGLEMODE LASER SOURCE TUNABLE IN WAVELENGTH WITH A SELF-ALIGNED EXTERNAL CAVITY

[75] Inventors: Hervé Lefevre, Paris; Philippe Martin, Pontchartrain; Bernard LaLoux, Villepreux; Philippe Graindorge, Chevigny-St-Sauveur; Laurent Disdier, Marly-Le-Roi, all of France

[73] Assignee: Photonetics S.A., Marly-Le-Roy, France

[*] Notice: The term of this patent shall not extend beyond the expiration date of Pat. No. 5,594,744.

[21] Appl. No.: 748,915

[22] Filed: Nov. 13, 1996

Related U.S. Application Data

[62] Division of Ser. No. 432,021, May 1, 1995, Pat. No. 5,594,744.

[30] Foreign Application Priority Data

Sep. 13, 1994 [FR] France .................. 94 10925

[51] Int. Cl.$^6$ .................................................. H01S 3/10
[52] U.S. Cl. ........................... 372/20; 372/99; 372/102
[58] Field of Search ........................ 372/20, 96, 99, 372/102

[56] References Cited

U.S. PATENT DOCUMENTS

| | | | |
|---|---|---|---|
| 5,379,310 | 1/1995 | Papen et al. ........................ | 372/102 |
| 5,594,744 | 1/1997 | Lefevre et al. ..................... | 372/102 |

FOREIGN PATENT DOCUMENTS

| | | |
|---|---|---|
| 56-90642 | 7/1981 | Japan . |
| WO94/08371 | 4/1994 | WIPO . |

OTHER PUBLICATIONS

Patent Abstracts of Japan, vol. 6, No. 185 (E–132) [063], 21 Sep. 1982 & JP-A-57 099793 (T. Tomijima) 21 Jun. 1981.

Optics Letters, vol. 6, No. 3, Mar. 1981 Washington US, pp. 117–118, K. Liu, M.G. Littman "Novel Geometry for Single–Mode Scanning of Tunable Lasers".

Electronic Letters, vol. 27, No. 2, Jan. 17, 1991, Stevenage, GB, pp. 183–184, XP 000201222, F. Favre, D. Le Guen, "82nm of Continuous Tunability for an External Cavity".

Optics Letters, vol. 17, No. 14, Jul. 15, 1992, New York, U.S. pp. 997–999, XP 000288960 G.Z. Zhang, K. Hakuta "Scanning Geometry for Broadly Tunable Single–Mode Pulsed Dye Lasers".

Applied Optics, vol. 23, No. 24, Dec. 15, 1984, New York, US, pp. 4465–4468, M.G. Littman "Single–Mode Pulsed Tunable Dye Laser".

Conference on Lasers and Electro–Optics (CLEO)—Technical Digest Series, vol. 12, May 10, 1992 Washington, pp. 306–308, XP 000351496 R.S. Putman "Laser–Mode Spacing is Independent of Cavity Length".

*Primary Examiner*—Rodney B. Bovernick
*Assistant Examiner*—Robert E. Wise
*Attorney, Agent, or Firm*—Nikaido, Marmelstein, Murray & Oram LLP

[57] ABSTRACT

This invention relates to a singlemode laser source tunable in wavelength with a self-aligned external cavity, comprising: a resonant cavity having an output face that is partially reflecting (331) and a retroreflecting dispersive device (31, 39), defining a main collimating axis (351) and a secondary collimating axis (381), an amplifier wave guide (33) placed in position inside the resonant cavity. The retroreflecting dispersive device comprises a plane diffraction grating (31) having dispersion planes and an orthogonal reflecting dihedral (39) whose line of intersection (391) is parallel to the dispersion plane of the diffraction grating containing the collimating axes (351, 352).

1 Claim, 6 Drawing Sheets

SINGLEMODE LASER SOURCE TUNABLE IN WAVELENGTH WITH A SELF-ALIGNED EXTERNAL CAVITY

This is a division of application Ser. No. 08/432,021, filed May 1, 1995 now U.S. Pat. No. 5,594,744.

BACKGROUND OF THE INVENTION

1. Field of the Invention

This invention relates to a singlemode laser source tunable in wavelength having an external cavity.

2. Background of the Invention

It is known that an optical cavity resonated by a laser source selects one or more wavelengths emitted by a laser amplifier medium. This cavity frequently comprises two mirrors, one of which is partially transparent, forming what is known as a Fabry-Perot cavity. Such a Fabry-Perot cavity selects, or resonates for half-wavelengths equal to sub-multiples of the cavity's optical length $L_{op}$, and which are therefore generally very closely spaced. Several wavelengths are therefore likely to be amplified by the wide spectrum amplifier medium. One thus obtains a multimode laser.

For certain applications, singlemode lasers are preferred. It is then necessary to implement a resonant optical cavity which associates a supplemental selection means with the Fabry-Perot cavity, for example by replacing one of its mirrors with a retroreflecting dispersive device.

Retroreflecting dispersive devices are commonly used in conventional optics. The most well-known device is probably the p-pitch plane diffraction grating used in the Littrow configuration.

In a general way, the dispersion plane of a p-pitch plane diffraction grating is perpendicular to its lines. A collimated light beam of wavelength $\lambda$, inclined at an angle $\theta_1$ with respect to the normal of the diffraction grating which is parallel to the dispersion plane of the diffraction grating, produces a collimated beam that is also parallel to the dispersion plane and having a direction inclined at an angle $\theta_2$ with respect to the normal, $\theta_1$ and $\theta_2$ being connected by the relationship:

$$p \sin \theta_1 + p \sin \theta_2 = \lambda$$

The Littrow configuration in which this diffraction grating behaves as a dispersive retroreflecting system, corresponds to the case where $\theta_1 = \theta_2 = \theta$, in other words:

$$2p \sin \theta = \lambda$$

Figures 1, 2:
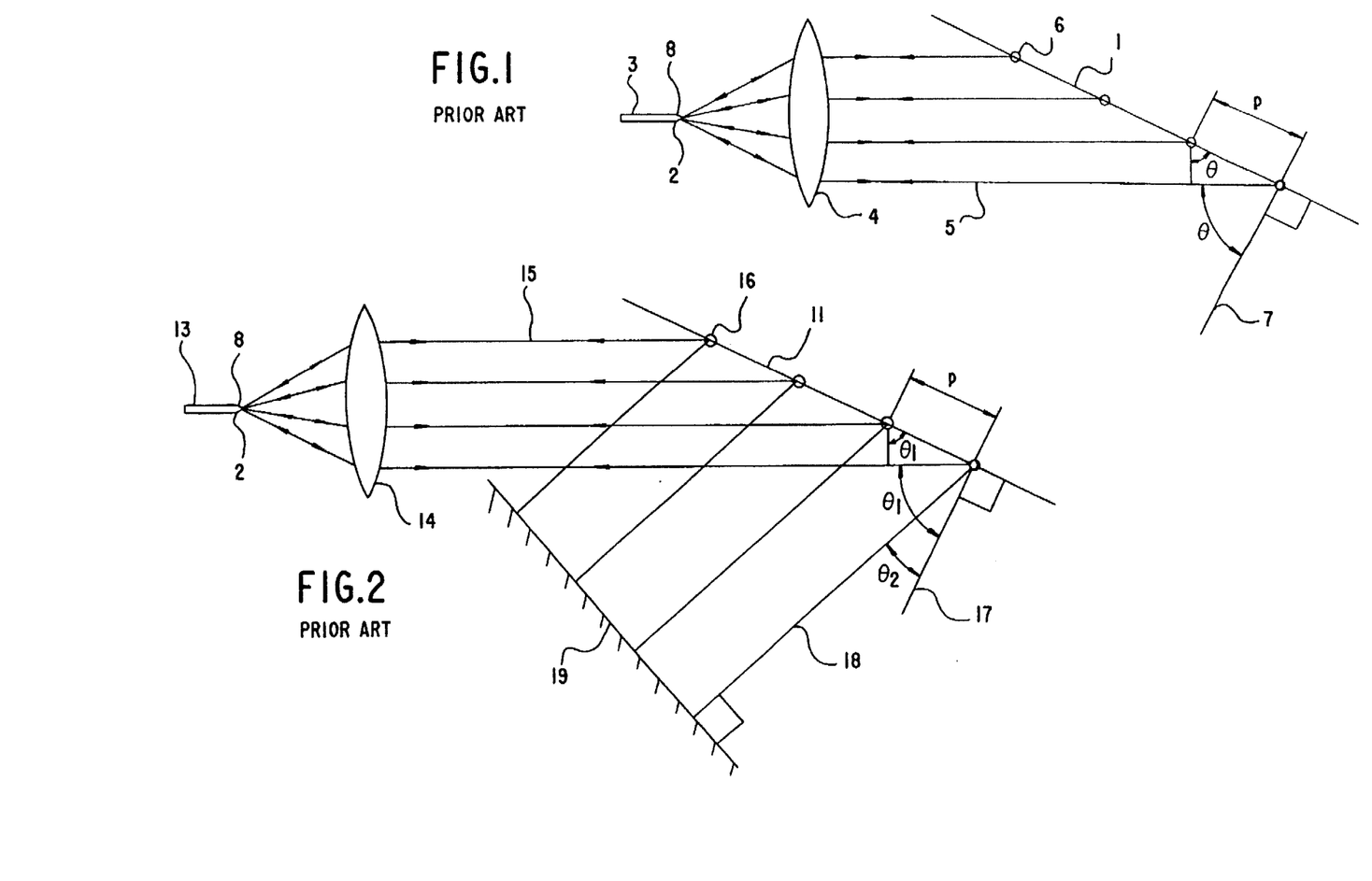
FIG. 1 is a conventional prior art assembly according to the Littrow configuration.
FIG. 2 is a conventional prior art assembly according to the Littman-Metcalf configuration.

FIG. 1 shows a diffraction grating 1 implemented according to the Littrow assembly, in which an end 2 of a guided amplifier medium 3 is placed in position at the focal point of a collimating lens 4 which produces a collimated parallel beam 5 of wavelength $\lambda$.

This beam is parallel to the dispersion plane of the diffraction grating, i.e. to the plane perpendicular to lines 6 of diffraction grating 1, and forms an angle $\theta$ with the normal 7 to the surface of diffraction grating $\lambda$.

In these conditions, p being the pitch of the diffraction grating, it is already known that when the relationship $2p \sin \theta = \lambda$ is satisfied, diffraction grating 1 reflects beam 5 back on itself, therefore producing an image point 8 superimposed on end 2.

Such retroreflecting dispersive devices have been used, for example, to make up one of the retroreflecting systems for a resonant laser cavity in order to select one or certain beams that the cavity is able to generate. It is known for example from French patent FR-2.595.013 tunable singlemode laser sources in which the emission wavelength is selected in the wide spectrum of an amplifier waveguide with an external cavity comprising a retroreflection dispersive diffraction grating in a Littrow configuration. A movement changing the angular orientation of this dispersive device makes it possible to vary the wavelength selected and emitted by the external cavity tunable laser source.

In these different devices, the retroreflected wavelength depends on the angular orientation of a diffraction grating about an axis parallel to its lines and therefore perpendicular to the dispersion plane. This axis is called the selection axis. It is also known that such external cavity tunable laser sources can operate with what is known as a Littman-Metcalf configuration in which the incident collimated beam makes an angle $\theta_1$ with the normal to the diffraction grating. An additional mirror is placed in position such that its normal makes an angle $\theta_2$ on the diffraction grating. The wavelength $\lambda$ respecting $\lambda = p \sin \theta_1 + p \sin \theta_2$ is dispersed by the diffraction grating at an angle $\theta_2$, retroreflected on the mirror which is thus perpendicular to it, and finally, on returning, dispersed again in the diffraction grating, and is output at the input angle $\theta_1$. This wavelength $\lambda$ is therefore selected in the cavity. Wavelength tunability is obtained by varying the orientation of the diffraction grating-mirror assembly, i.e. by varying $\theta_1$, or by varying only the orientation of the mirror, i.e. by varying $\theta_2$, or finally by varying only the orientation of the diffraction grating, i.e. by varying $\theta_1$ and $\theta_2$ while keeping $\theta_1 - \theta_2$ at a constant value.

FIG. 2 shows a diffraction grating 11 implemented according to the Littman-Metcalf configuration in which an end 2 of a guided amplifier medium 13 is placed at the focal point of a collimating lens 14 which produces a main collimated beam 15 of wavelength $\lambda$.

This beam is parallel to the dispersion plane of the diffraction grating, i.e. to the plane perpendicular to lines 16 of diffraction grating 11, and forms an angle $\theta_1$ with the normal 17 to the surface of diffraction grating 11. By diffraction on the diffraction grating, beam 14 produces a secondary collimated beam 18 which is in the dispersion plane and forms an angle $\theta_2$ with normal 17. A plane mirror 19 is placed in position perpendicular to beam 18 and the beam retroreflects through the whole system.

In these conditions, p being the pitch of the diffraction grating, it is already known that when the relationship $p \sin \theta_1 + p \sin \theta_2 = \lambda$ is satisfied, beam 15 reflects back on itself after a first diffraction on diffraction grating 11, retroreflection on mirror 19 and a second diffraction on diffraction grating 11. It therefore produces an image point 8 superimposed on end 2.

The adjustment of such devices also calls for the precise positioning of the diffraction grating about an axis perpendicular to the selection axis and parallel to the dispersion plane. This last adjustment and its stability are very delicate and govern, in most cases, the quality of the result obtained.

Figure 3A:
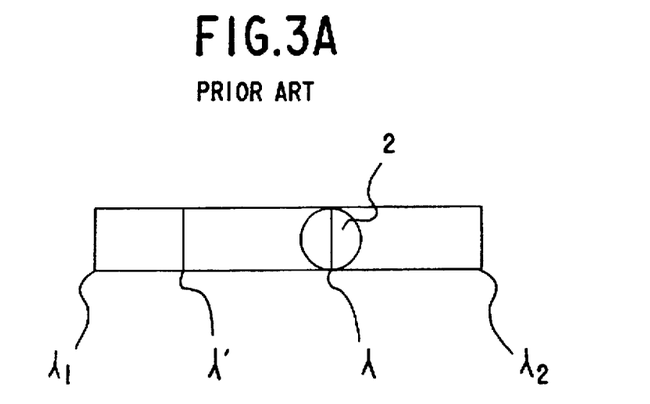
FIGS. 3A and 3B are diagrammatical drawings of the light spectrum retroreflected in the plane of the source, for two different orientations of the diffraction grating of FIG. 1, or of the diffraction grating or mirror of FIG. 2.

To provide a better understanding of this description, FIG. 3A represents a view of the focal plane of the collimating lens, showing end 2 of a guided amplifier medium and the spectrum produced in return by the assemblies in FIGS. 1 and 2 when the amplifier emits a wide spectrum. A spectrum is thus obtained which extends from a wavelength $\lambda_1$ to a wavelength $\lambda_2$, and for which the wavelength $\lambda$ is retroreflected on end 2 and therefore selected in the cavity.

Figure 3B:
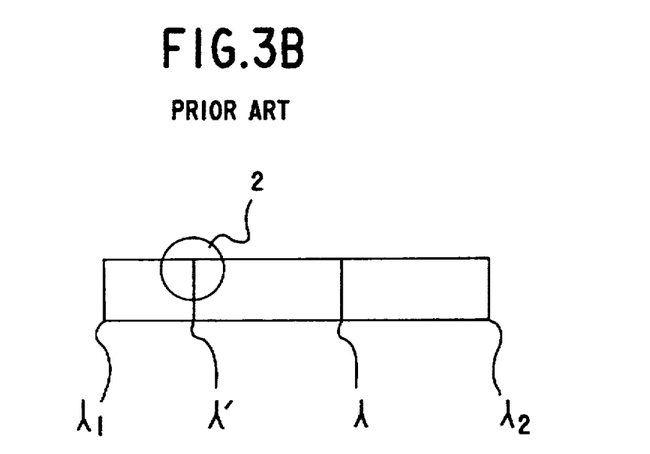

In practice, since the real axis of rotation cannot be exactly parallel to the lines of the diffraction grating, the displacement of the spectrum in the focal plane will be accompanied by a movement perpendicular to said focal plane and when wavelength λ' is retroreflected this will result in a configuration such as that shown in FIG. 3B in which retroreflection is not obtained exactly because of the displacement of the spectrum perpendicularly to itself, at the same time as parallel to itself in the focal plane of the collimating lens.

Consider, for example, the use of a laser diode as an amplifier medium producing a spectrum extending, in a first case, from 1470 to 1570 nm and, in a second case, from 1260 to 1340 nm, when it is desired to modify the retroreflected wavelength which then becomes λ', taking into account the Littrow relationship stated above, this is achieved by rotating the diffraction grating which should, if performed about an axis parallel to lines 6 of the diffraction grating, produce a simple translation of the spectrum $\lambda_1$, $\lambda_2$ and bring the wavelength λ' to coincide with end 2.

In the Littman-Metcalf configuration, the same problem arises when diffraction grating 11 or mirror 19, or both, undergo rotation about an axis parallel to lines 16 of the diffraction grating.

Such devices can also generate mode jumping. Indeed, rotation of the diffraction grating dispersive device changes the selected wavelength, but this wavelength must also satisfy the resonance condition applicable to all optical cavities that states that the optical length Lop of the cavity is equal to a whole number N of half wavelength:

$$L_{op} = N \cdot \lambda/2$$

If the selected wavelength is lowered, the cavity must at the same time be shortened, and conversely lengthened if the wavelength increases, in order to stay on the same whole number N and avoid mode jumping.

Such a continuous tunability device without mode jumping has been proposed with a Littrow configuration (F. Favre and D. Le Guen, "82 nm of continuous tunability for an external cavity semiconductor laser", Electronics Letters, Vol.27, 183–184, [1991]), but calls for a complex mechanical assembly using two translation movements and two rotation movements.

The object of the invention is to provide a tunable laser cavity comprising a simple-to-adjust, self-aligned, retroreflecting dispersive device offering a large adjustment tolerance about an axis perpendicular to the axis of the secondary collimated beam and parallel to the dispersion plane and therefore having substantial mechanical stability.

A further object of the invention is to provide a method for displacing a self-aligned dispersive device in order to produce continuous tuning without mode jumping.

Yet a further object of the invention is to provide displacement of the self-aligned dispersive device by means of a simple rotation in order to obtain continuous tuning without mode jumping.

SUMMARY OF THE INVENTION

To achieve this, the invention relates to a singlemode laser source tunable in wavelength with a self-aligned external cavity, comprising a resonant cavity having a partially reflecting output face and a retroreflecting dispersive device, defining a main collimating axis and a secondary collimating axis, an amplifier wave guide placed in position inside the resonant cavity.

According to the invention, the retroreflecting dispersive device comprises a plane diffraction grating having dispersion planes and an orthogonal reflecting dihedral whose line of intersection is parallel to the dispersion plane of the diffraction grating containing the collimating axes.

In different embodiments of the invention each with their own specific advantages, the device of the invention comprises the following characteristics taken alone or in any possible combinations thereof:

point A being the point of intersection of the collimating axes and diffraction grating, point B' being the optical end of the cavity located on the side of the dispersive system, point C' being the intersection of the main collimating axis with the optical end of the cavity located on the side of the amplifier medium, point D being the intersection of the plane containing the diffracting face of the diffraction grating with the parallel to the line of intersection of the dihedral passing through B', the angle AC'D is maintained equal to 90°, the length AD is maintained constant, in such a way as to produce a continuously tunable source.

The movements of the diffraction grating and of the dihedral are connected in such a way that they are mobile together and fixed with respect to each other.

The diffraction grating and the dihedral are supported by a plate which can move in rotation about an axis of rotation passing via the point A, said plate being integral with an axis arm, said arm having a bearing point on a plane fixed in translation, with respect to a frame, the axis of rotation being supported by a mobile element which can move in translation parallel to the axis of the collimated beam, with respect to the frame, the continuous tunability of the source being obtained by the displacement of the mobile element and the maintaining of the bearing point on the plane.

A return spring, fixed at one of its ends to an arm of the plate and at the other of its ends to the frame, keeps the bearing point pressed against the plane.

The diffraction grating is fixed and the dihedral mobile.

The dihedral is supported by a support which can move about an axis perpendicular to the dispersion plane and passing via the point D.

The diffraction grating is supported by a frame, and a motor integral with said frame and activating a push-rod connected to said frame and driving a push-rod connected to the support controls the orientation of the dihedral.

The amplifier medium is a laser diode.

One of the faces of the laser diode is only slightly reflecting and constitutes the output face to the external cavity.

The amplifier medium is a doped optical fiber.

A collimated beam produced by ordinary reflection on the diffraction grating constitutes a useful source.

BRIEF DESCRIPTION OF THE DRAWINGS

The invention will be described in detail with reference to the attached drawings. In these drawings:

FIGS. 4, 5 and 6 have been shown on the same sheet and separated from each other by hatched lines parallel to the collimated beams so as to allow the establishment of correspondences between the elements of these different Figures.

DESCRIPTION OF THE PREFERRED EMBODIMENTS

Figure 4:
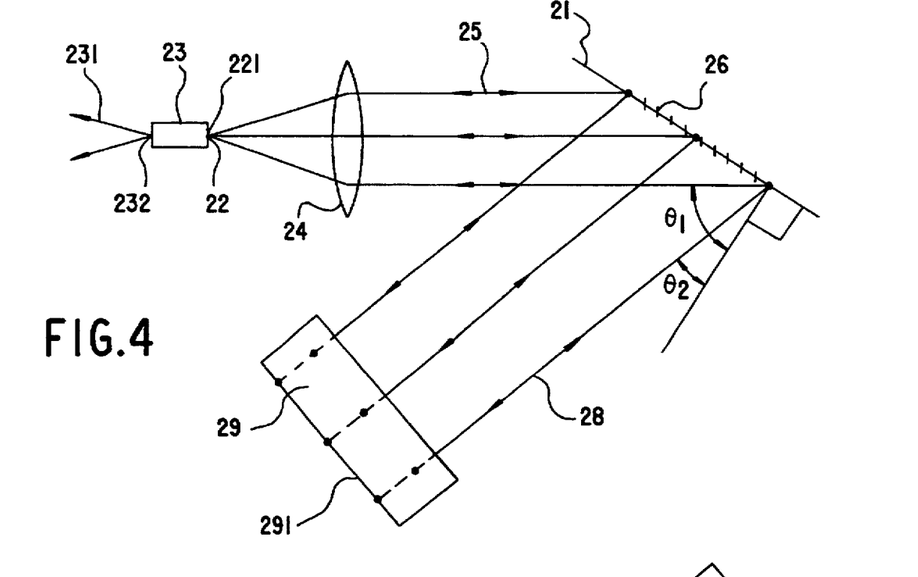
FIG. 4 shows a view from above of a self-aligned, tunable laser cavity of the invention.
Figure 5:
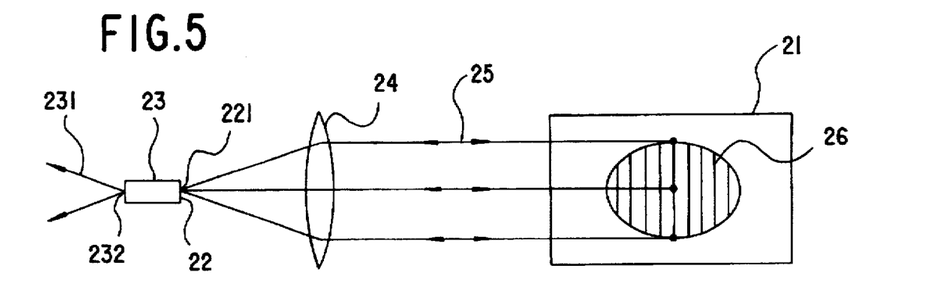
FIG. 5 is a front view of this same device.
Figure 6:
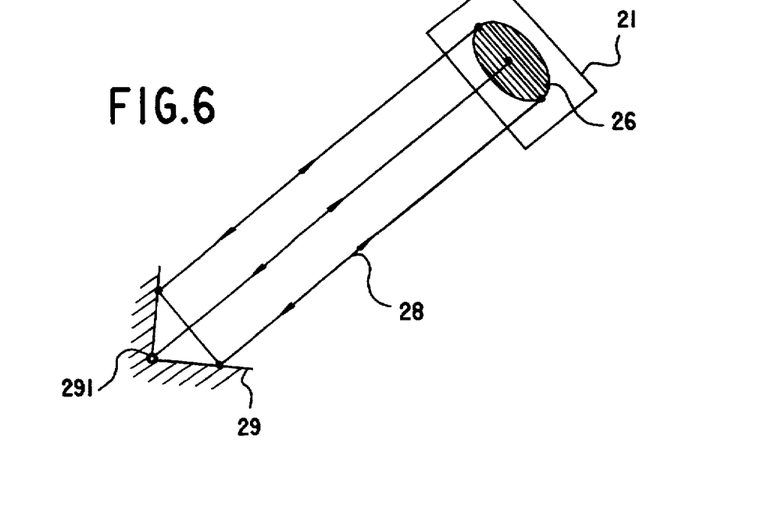
FIG. 6 is a side view of this same device.

The device of the invention comprises a diffraction grating 21 working with a guided amplifier medium 23, having an internal end 22 facing diffraction grating 21 and which, by means of a collimating lens 24, produces a collimated beam 25 of wavelength L. This beam 25 dispersed by diffraction grating 21 provides diffracted beam 28.

This diffraction grating is a plane diffraction grating which can be an engraved diffraction grating or holographic diffraction grating working in reflection or transmission. The following description, however, applies to the case of a diffraction grating working in reflection.

The term "dispersion plane" designates the plane perpendicular to lines 26 of diffraction grating 21 containing end 22 of guided amplifier medium 23.

This device also comprises an orthogonal dihedral 29 which reflects beam 28 which returns on itself, and then after diffraction on diffraction grating 21, returns superimposed with beam 25. Collimating lens system 24 focuses the returning image at 221.

This device provides a diverging beam 231 via output face 232 of amplifier medium 23.

Orthogonal dihedral 29 is made up of two plane mirrors having precisely an angle of 90°. It can be made up of two assembled plane mirrors, or an isosceles right-angled prism whose input face corresponding to the hypotenuse of the isosceles right-angled triangle is anti-reflection treated.

Preferably, guided amplifier medium 23 is a laser diode or a doped optical fiber having an inner end 22.

Thus, only the wavelength of beam 25 dispersed by diffraction grating 21, perpendicularly to line of intersection 291 of dihedral 29, is retroreflected, and produces an image 221 superimposed on end 22. It is this that produces the wavelength selection, thereby taking advantage of the dispersion of diffraction grating 21.

The orientation of dihedral 29 about its line of intersection 291, with respect to the dispersion plane of diffraction grating 11, does not require very high precision. Indeed, it is known that with orthogonal dihedral 29, an incident beam contained in a plane parallel to line of intersection 291 is returned in a plane parallel to the incident plane. The precision of the parallelism depends on the precision of the right angle formed by the two reflecting faces of dihedral 29, which is fixed by construction to be very accurate (several arc seconds for example). Thus, the assembly formed by diffraction grating 21 and dihedral 29 constitutes a self-aligned retroreflecting device.

Dihedral 29 also compensates for instabilities in the orientation of diffraction grating 21 about axes parallel to the plane of dispersion.

Figure 7:
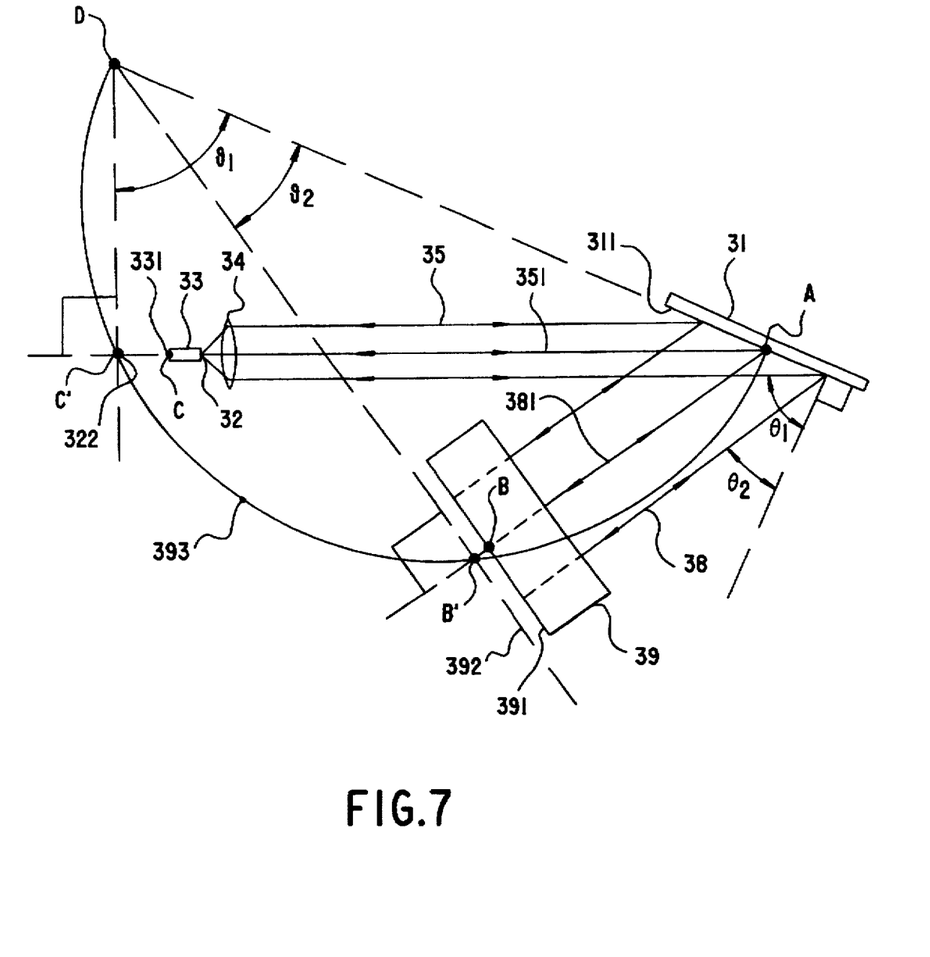
FIG. 7 shows a self-aligned, continuously tunable, laser cavity according to the invention.

Movement of the self-aligned retroreflecting device as a whole or the separate movements of these components make it possible to change the length of the cavity in the same ratio as the change in wavelength, so as to ensure continuous tunability without mode jumping. FIG. 7 shows a continuously tunable self-aligned laser source thus obtained. A guided amplifier medium 33 has an inner end 32 placed at the focal point of a collimating lens 34 which produces a collimated beam 35. This beam is dispersed on a plane diffraction grating 31. The dispersed beam 38 is retroreflected on an orthogonal dihedral 39 having a line of intersection 391. The point at which central axis 351 of collimated beam 35 intersects diffraction grating 31 is called point A. Point B is the point at which central axis 381 of collimated beam 38 intersects line of intersection 391 which is one of the physical ends of the cavity. If the dihedral is a right-angled isosceles triangle of refractive index $n_d$, the optical end of the cavity is shifted onto the virtual line 392 and B' is the point at which this line 392 intersects the central axis of collimated beam 38. The geometric length AB' is therefore equal to the optical length of the part of the cavity located between A and B.

The "optical length" of an element refers here, like in interferometry, to the product of its geometric length by the refractive index of the medium making it up.

The other physical end of the cavity is output face 331 of guided amplifier medium 33. The intersection of main collimating axis 35 with output face 331 is designated C, and that with the optical end 322 of the cavity is designated C', moved backwards due to the index of amplifier medium 33 and that of collimating lens 34. Geometric length AC' is equal to the optical length of the part of the cavity located between A and C.

Optical length $L_{op}$ of the cavity is therefore:

$$L_{op} = (AB' + AC')$$

Point D is defined as being the intersection of the plane containing diffracting face 311 of diffraction grating 31 with straight line 392 parallel to line of intersection 391 and passing via B'. Triangle AB'D is right-angled at B' since dispersed beam 38 is itself perpendicular to line of intersection 391.

Continuous tunability is obtained when the movement of the dihedral and of the diffraction grating satisfies the following two conditions:

angle AC'D is equal to 90°, length AD is constant.

These conditions are met when points C' and B' remain on a half-circle 393 of diameter DA, this diameter retaining a constant length.

Indeed, the condition governing resonance of the cavity is:

$$L_{op} = (AC' + AB') = N \lambda/2$$

where $L_{op}$ is the optical length of the cavity, $\lambda$ is the selected wavelength, N is a whole number. now $AB' = AD \sin \theta_2$ since angle AB'D is a right-angle by principle, and $AC' = AD \sin \theta_1$ since angle AC'D is a right-angle according to the first condition above, therefore:

$$AD (\sin \theta_1 + \sin \theta_2) = N\lambda/2$$

The law of dispersion of the diffraction grating being:

p (sin θ₁+sin θ₂)=λ p being the pitch of the diffraction grating, we obtain:

$$\frac{2AD}{p} = N$$

The second condition (length AD constant) therefore results in a constant value of N irrespective of the value of λ and therefore in continuous tunability without mode jumping.

These two conditions can be obtained in particular in two embodiments.

In a first embodiment, the diffraction grating and the dihedral are mounted on a common support undergoing a combined translation of point A parallel to AC', and translation of point D parallel to C'D, the right-angled triangle AB'D being maintained undeformed and therefore undergoing rotation.

Figure 8:
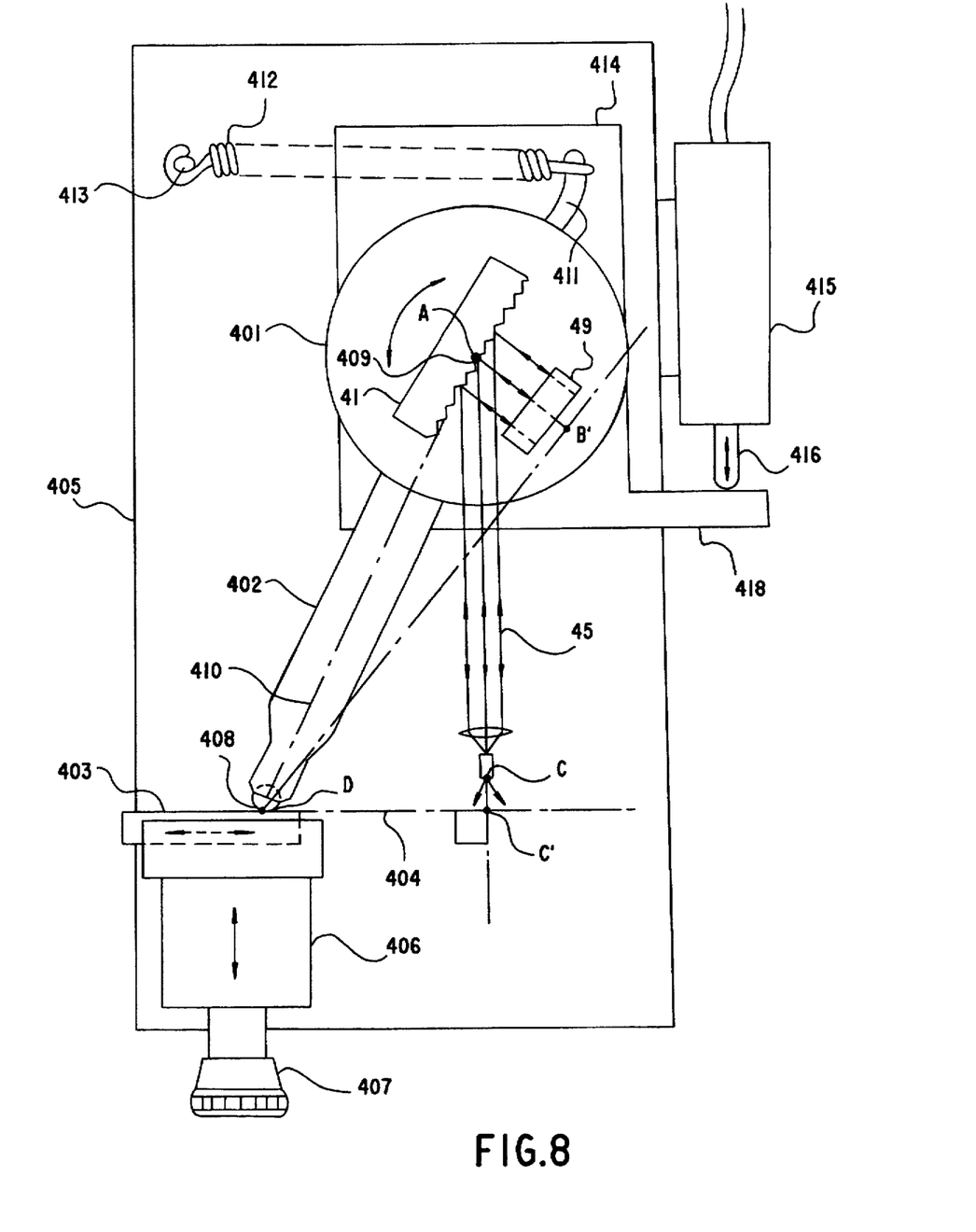
FIG. 8 shows a self-aligned, continuously tunable, laser cavity according to the invention, using a combined movement of two translations.

This result is obtained when, as shown in FIG. 8, diffraction grating 41 and dihedral 49 are advantageously carried by a same mechanical support or turning plate 401 having an integral arm 402. This arm bears against a fixed translation plane 403 of axis 404 perpendicular to the axis of beam 45, positioned and adjusted with respect to frame 405, by means of adjustment means 406 controlled by micrometer screw 407. The bearing point 408 of arm 402 on translation plane 403 is in the plane containing the diffracting face of diffraction grating 41 and the axis of rotation 409 of diffraction grating 41. This axis of rotation 409 defines with bearing point 408, an axis 410. At the other end of support 401, a coupling 411 is connected to frame 405 by means of a spring 412 whose second end is fixed onto a pin 413 supported by frame 405.

Rotating plate 401 is itself fixed onto the mobile element of a translation plate 414 fixed onto frame 405.

Spring 412 exerts, on plate 401, a return force which maintains pin 402 in contact with plane 403. Motor 415 controlling jack rod 416 can produce the translation movement of mobile element 414 by bearing on pin 418 integral with this mobile element.

Thus, motor 415, on producing the translation movement of mobile element 414, drives the assembly formed by diffraction grating 41 and dihedral 49 so as to modify the length of the resonant cavity of the source.

Simultaneously, arm 402, which bears against reference plane 403, causes the assembly formed by the diffraction grating 41 and dihedral 49 to rotate about axis 409.

The distance AD between axis of rotation 409 and bearing point 408 remains constant during this movement. Axis 409 corresponds to point A of the preceding explanation and point 408 to point D. Dihedral 49 is positioned on turning plate 401 such that triangle AB'D is right-angled at B'. This therefore results in an assembly which satisfies the continuous tunability conditions described with reference to FIG. 7.

A second embodiment uses a fixed diffraction grating, the dihedral being mounted on a mobile support which is able to turn about the axis perpendicular to the dispersion plane and passing via D.

Figure 9:
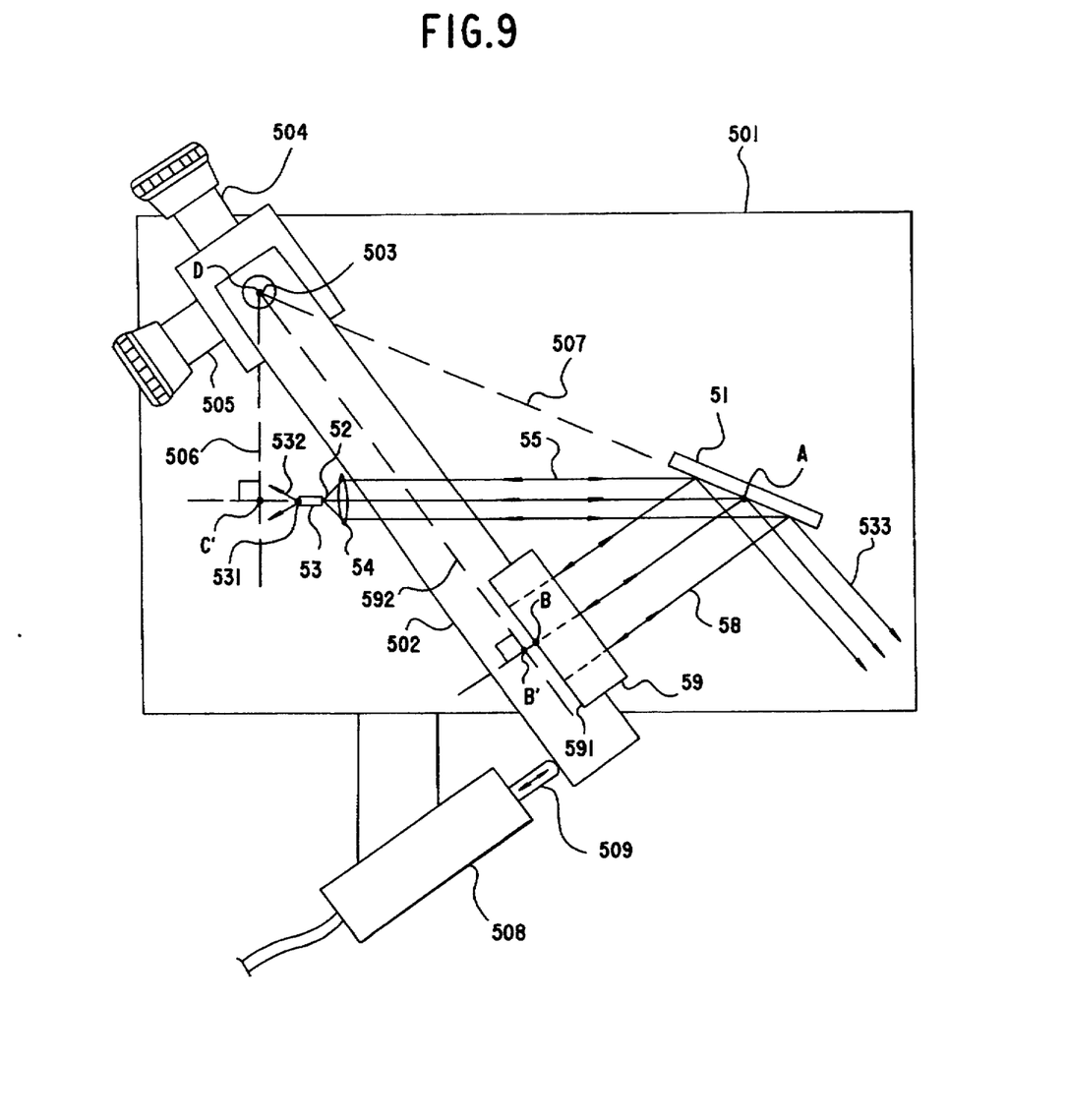
FIG. 9 shows a self-aligned, continuously tunable, laser cavity according to the invention, using a simple rotation movement.

Diffraction grating 51, guided amplifier medium 53 and collimating lens 54 are fixed onto a frame 501. Dihedral 59 is fixed onto a moving support 502 turning about an eccentric axis 503, such that straight line 592 parallel to line of intersection 591 passing via the point B' and which is the optical end of the cavity, also passes through axis 503.

This axis 503 is fixed on a translation movement assembly 504 and 505 which allows said axis to be positioned at point D where the perpendicular 506 to the axis of the cavity which passes via C', intersects with straight line 507 passing via face 511 of diffraction grating 51. A motor 508, fixed onto frame 501, activates a rod 509 which drives in rotation about axis 503 both the support and the dihedral 59 which is fixed to it. Thus diffracted beam 58 selected in the cavity remains perpendicular to line of intersection 591.

During the rotation of mobile support 502, beam 58 moves laterally on dihedral 59, as does B' along straight line 592. This displacement of the beam is a geometric translation of said beam which does not involve translation of mechanical parts.

This second method of obtaining continuous tunability is therefore particularly practical from the point of view of mechanical design since it uses simple mechanical rotation.

This tunable source provides a diverging beam 532 at the output 531 of amplifier medium 53, but it is also possible to easily use collimated beam 533 which corresponds to the ordinary reflection of beam 555 on diffraction grating 51. This ordinary reflection, also known as the zero order of the diffraction grating, maintains a fixed direction since the diffraction grating is fixed to the frame and only the dihedral moves during wavelength adjustment.

In each of the embodiments, the guided amplifier medium is advantageously a laser diode of which one of the faces constituting its inner end 2, 22, 32, 42, 52 has been made only slightly reflecting by means of antireflecting treatment. Its reflection factor is advantageously less than $10^{-4}$. This face allows the emission of a light flux which is directed to the retroreflecting dispersive device.

Its other face, which constitutes the output face, is partially reflecting. It emits a diverging beam constituting the output beam of the source. It can be used in any conventional way, and can in particular be coupled to an optical plug after passing through an isolator to avoid unwanted interference which could be generated by parasitic reflections returning to the source.

Good results are obtained using diodes emitting between 1470 and 1570 nm, or diodes emitting between 1260 and 1340 nm.

Thus, from all the light beams emitted inside the cavity, only the one corresponding to the selection made by dispersive system 11, 21 is selected and therefore able to resonate to produce laser emission.

We claim:

1. Singlemode laser source tunable in wavelength with a self-aligned external cavity, comprising:

a resonant cavity having a partially reflecting output face and a retroreflecting dispersive device defining a main collimating axis and a secondary collimating axis; and an amplifier wave guide disposed inside the resonant cavity, wherein the retroreflecting dispersive device comprises a plane diffraction grating having dispersion planes and an orthogonal reflecting dihedral whose line of intersection is parallel to the dispersion plane of the diffraction grating containing the collimating axes, and wherein the diffraction grating and the dihedral each have an orientation; said laser source further comprising adjustment means for adjusting the orientation of at least one of the elements including the diffraction grating and the dihedral.

* * * * *